United States Patent
Choi et al.

(10) Patent No.: US 8,963,580 B2
(45) Date of Patent: Feb. 24, 2015

(54) LOGIC DEVICE AND METHOD OF OPERATING THE SAME

(75) Inventors: Hyun-sik Choi, Hwaseong-si (KR); Ho-jung Kim, Suwon-si (KR); Ki-chul Kim, Seoul (KR); Jai-kwang Shin, Anyang-si (KR); Joong-ho Choi, Seoul (KR); Hyung-su Jeong, Suwon-si (KR)

(73) Assignees: Samsung Electronics Co., Ltd., Gyeonggi-Do (KR); University of Seoul Industry Cooperation Foundation, Seoul (KR)

( * ) Notice: Subject to any disclaimer, the term of this patent is extended or adjusted under 35 U.S.C. 154(b) by 241 days.

(21) Appl. No.: 13/597,732

(22) Filed: Aug. 29, 2012

(65) Prior Publication Data

US 2013/0049802 A1 Feb. 28, 2013

(30) Foreign Application Priority Data

Aug. 31, 2011 (KR) ........................ 10-2011-0087847

(51) Int. Cl.
*H03K 19/173* (2006.01)
*H03K 19/177* (2006.01)

(52) U.S. Cl.
CPC .............................. *H03K 19/17756* (2013.01)
USPC ................... 326/38; 326/41; 326/47

(58) Field of Classification Search
USPC ................................. 326/37–41, 47
See application file for complete search history.

(56) References Cited

U.S. PATENT DOCUMENTS

| | | | |
|---|---|---|---|
| 2009/0045838 A1 | 2/2009 | Fujisawa | |
| 2009/0292978 A1 | 11/2009 | Miyama et al. | |
| 2010/0277968 A1 | 11/2010 | Tokiwa | |
| 2012/0326748 A1* | 12/2012 | Kim et al. | 326/38 |

FOREIGN PATENT DOCUMENTS

| KR | 10-2001-0002996 B1 | 1/2001 |
|---|---|---|
| KR | 10-2001-0086363 B1 | 9/2001 |

* cited by examiner

*Primary Examiner* — Jany Richardson
(74) *Attorney, Agent, or Firm* — Harness, Dickey & Pierce, P.L.C.

(57) ABSTRACT

A logic device may include a first functional block, the first functional block including, a first storage block, a second storage block, and a first function controller. In a first operation time period, the first function controller may be configured to receive a first configuration selection signal and a first configuration command signal that instructs a first function be configured, select the first storage block as a configured storage block in the first operation time period based on the first configuration selection signal, and configure the first function in the first storage block based on the first configuration command signal.

20 Claims, 13 Drawing Sheets

<OT2>

<OT3>

LOGIC DEVICE AND METHOD OF OPERATING THE SAME

CROSS-REFERENCE TO RELATED APPLICATIONS

This application claims priority under 35 U.S.C. §119 to Korean Patent Application No. 10-2011-0087847, filed on Aug. 31, 2011, in the Korean Intellectual Property Office, the entire disclosure of which is incorporated herein by reference.

BACKGROUND

1. Field

Example embodiments relate to logic devices and/or methods of operating the same.

2. Description of the Related Art

Recently, use of configurable/reconfigurable logic devices, e.g. a programmable logic device (PLD) that can be easily designed by a user, has become widespread. A user may configure or reconfigure a logic device to perform a desired function by controlling connections between signal lines included in the logic device.

SUMMARY

At least one example embodiment provides efficient logic devices and/or methods of operating the same.

Additional aspects will be set forth in part in the description which follows and, in part, will be apparent from the description, or may be learned by practice of the example embodiments.

According to at least one example embodiment, a logic device includes a first functional block, the first function block including a first storage block, a second storage block, and a first function controller. In a first operation time period, the first function controller configured to receive a first configuration selection signal and a first configuration command signal that instructs a first function be configured, selects the first storage block as a configured storage block in the first operation time period based on the first configuration selection signal, and configures the first function in the first storage block based on the first configuration command signal.

In the first operation time period, a second function may be already configured in the second storage block.

In the first operation time period, the first function controller may be further configured to receive a first function command signal, and perform the second function on the second storage block based on the first function command signal.

In a second operation time period, the first function controller may be configured to receive a second configuration selection signal and a second function command signal, select the second storage block as a configured storage block in the second operation time period based on the second configuration selection signal, and perform the first function on the first storage block based on the second function command signal.

In the second operation time period, the first function controller may be further configured to receive a second configuration command signal that instructs a third function be configured, and configure the third function on the second storage block, based on the second configuration command signal.

The logic device may further include a second functional block; and a connection unit.

The connection unit may include a first memory device; a second memory device; and a connection controller. In the first operation time period, the connection controller may be configured to select the first memory device as a configured memory device in the first operation time period based on the first configuration selection signal, and control a connection between the first functional block and the second functional block based on first connection information stored in the second memory device.

In the first operation time period, the connection controller may be configured to store second connection information in the first memory device.

In the second operation time period, the connection controller may be configured to select the second memory device as a configured memory device in the second operation time period based on the second configuration selection signal, and control a connection between the first functional block and the second functional block based on the second connection information stored in the first memory device.

The connection unit may further include a switch unit connected between the first functional block and the second functional block, the switch unit being controlled by the connection controller.

When the first function is configured, a first lookup table corresponding to the first function may be stored in the first storage block.

According to at least one example embodiment, a logic device includes a plurality of functional blocks, each of the plurality of function blocks including, a first storage block and a second storage block, one of the first storage block and the second storage block eing selected as a configured storage block based on the configuration selection signal, the configured storage block being configured to perform a write operation, and a non-configured notrage block that is not selected as the configured storage block being configured to perform a read operation; and a plurality of signal lines disposed between the plurality of functional blocks.

A first function may be configured in the configured storage block when the write operation is performed. A second function configured in the non-configured storage block may be performed when the read function is performed.

The logic device may further include a connection unit connected between a first signal line and a second signal line from among the plurality of signal liens, the connection unit configured to control a connection between the first and second signal lines using first connection information, the connection unit including, a first memory device and a second memory device. One of the first memory device and the second memory device may be selected as a configured memory device based on the configuration selection signal. First connection information may be read from a non-configured memory device that is not selected as the configured memory device from among the first and second memory devices.

Second connection information may be stored in the configured memory device.

Each of the first memory device and the second memory device may be a resistive memory device.

According to at least one example embodiment, a method of operating a logic device includes receiving a first configuration selection signal and a first configuration command signal that instructs a first function be configured in a functional block during a first operation time period, the functional block including a first storage block and a second storage block; selecting the first storage block as a configured storage block in the first operation time period based on the first configuration selection signal, in the first operation time period; and configuring a first function in the first storage block based on the first configuration command signal in the first operation time period.

The method may further include configuring a second function in the second storage block, before the first operation time period.

The method may further include receiving a first function command signal in the first operation time period; and performing the second function on the second storage block based on the first function command signal, in the first operation time period.

The method may further include receiving a second configuration selection signal and a second function command signal in a second operation time period; selecting the second storage block as a configured storage block in the second operation time period, based on the second configuration selection signal, in the second operation time period; and performing the first function on the first storage block based on the second function command signal, in the second operation time period.

The method may further include receiving a second configuration command signal in the second operation time period that instructs a third function be configured; and configuring the third function in the second storage block, based on the second configuration command signal, in the second operation time period.

BRIEF DESCRIPTION OF THE DRAWINGS

Example embodiments will become apparent and more readily appreciated from the following description accompanying drawings in which.

DETAILED DESCRIPTION OF EXAMPLE EMBODIMENTS

Hereinafter, example embodiments will be described in greater detail.

Example embodiments may, however, be embodied in many different forms and should not be construed as being limited to the embodiments set forth herein. Rather, these embodiments are provided so that this disclosure will be thorough and complete and will fully convey the inventive concepts to those of ordinary skill in the art.

The terminology used herein is for the purpose of describing particular embodiments only and is not intended to be limiting. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, devices, and/or components, but do not preclude the presence or addition of one or more other features, integers, steps, operations, devices, components, and/or groups thereof. As used herein, the term "and/or" includes any and all combinations of one or more of the associated listed items.

It will be understood that, although the terms first, second, third, etc., may be used herein to describe various devices, components, regions, layers and/or sections, these devices, components, regions, layers and/or sections should not be limited by these terms. These terms are only used to distinguish one device, component, region, layer or section from another region, layer or section. Thus, a first device, component, region, layer or section discussed below could be termed a second device, component, region, layer or section without departing from the teachings of the example embodiments.

Example embodiments are described herein with reference to cross-section illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

Figure 1:
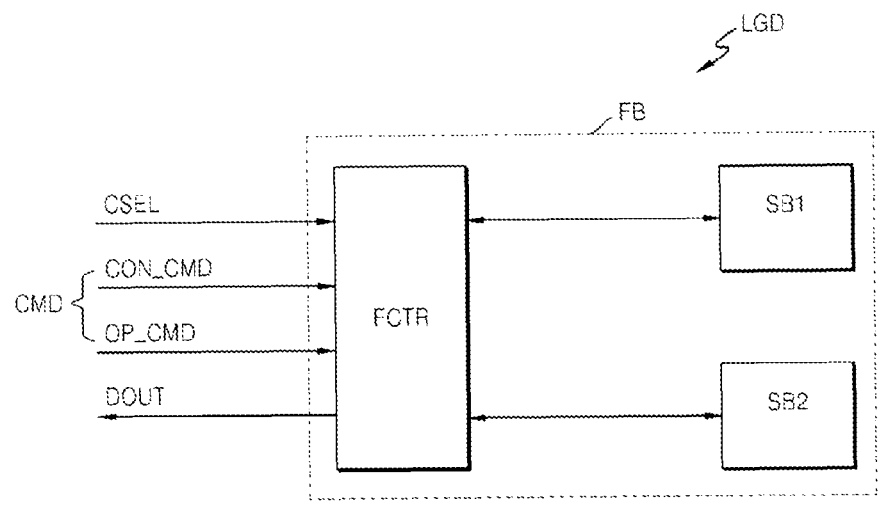
FIG. 1 is a block diagram of a logic device according to an example embodiment.

FIG. 1 is a block diagram of a logic device LGD according to an example embodiment. Referring to FIG. 1, the logic device LGD includes a functional block FB. The functional block FB includes a first storage block SB1, a second storage block SB2, and a function controller FCTR. The logic device LGD is a programmable logic device (PLD) that may be programmed by a user. For example, the logic device LGD may be a Field Programmable Gate Array (FPGA), a Programmable Array Logic (PAL), a Programmable Logic Array (PLA), a Generic Array Logic (GAL), or the like.

The functional block FB is a block in which a function may be configured or reconfigured and that may perform the configured/reconfigured function. For example, any of various functions, such as an error correction coding (ECC) function, an arithmetic and logic unit (ALU) function, compression function, and a security function, may be configured or reconfigured in the functional block FB. If the ALU function is configured in the functional block FB, then the functional block FB may perform the ALU function. If the compression function is reconfigured in the functional block FB in which the ALU function has already been configured, then the functional block FB may also perform the compression function. In other words, in the functional block FB, one of a plurality of functions may be configured and another function may be then reconfigured, in response to a request from a user or a host. In the present specification, the term, 'configure' may be understood as including 'reconfigure'.

Referring to FIG. 1, the logic device LGD includes one functional block FB, but example embodiments are not limited thereto and the logic device LGD may include a plurality of functional blocks FB.

In the functional block FB, the function controller FCTR may receive a configuration selection signal CSEL and a command signal CMD, and may output output data DOUT. The configuration selection signal CSEL and the command signal CMD may be received from the outside of the logic device LGD, e.g., a user or a host.

The function controller FCTR may select the first storage block SB1 or the second storage block SB2 as a configured storage block, based on the configuration selection signal CSEL. For example, the first storage block SB1 may be selected as the configured storage block when the configuration selection signal CSEL is '1', and the second storage block SB2 may be selected as the configured storage block when the configuration selection signal CSEL is '0'. The configuration selection signal CSEL may be a 1-bit signal.

Hereinafter, a storage block selected from among the first storage block SB1 and the second storage block SB2 according to the configuration selection signal CSEL will be referred to as a configured storage block, and the other storage block will be referred to as a non-configured storage block.

The command signal CMD may include a configuration command signal CON_CMD and a function command signal OP_CMD. In at least one example embodiment, the command signal CMD may include either the configuration command signal CON_CMD or the function command signal OP_CMD or may include both the configuration command signal CON_CMD and the function command signal OP_CMD.

The configuration command signal CON_CMD instructs that a first function from among a plurality of functions be configured in the configured storage block. The function controller FCTR configures the first function in the configured storage block based on the configuration command signal CON_CMD. The configuring of the first function means that the first function is written to or programmed in the configured storage block. The configuring of the first function may be understood as writing a first lookup table corresponding to the first function to the configured storage block. The first lookup table defines one-to-one correspondences between a plurality of pieces of input data, which may be input in relation to the first function, and a plurality of pieces of output data DOUT.

In the non-configured storage block, a second function that is another function from among the plurality of functions may have already been configured. The function command signal OP_CMD instructs that the second function be performed on the non-configured storage block in which the second function has been configured. The function controller FCTR performs the second function on the non-configured storage block based on the function command signal OP_CMD. The output data DOUT may be a result of performing the second function. The output data DOUT may be output outside the functional block FB via the function controller FCTR. The performing of the second function may be reading the output data DOUT from the non-configured storage block according to the function command signal OP_CMD.

The functional block FB may simultaneously receive the configuration selection signal CSEL, the configuration command signal CON_CMD, and the function command signal OP_CMD. The configured storage block may be selected from among the first storage block SB1 and the second storage block SB2, based on the configuration selection signal CSEL. The first function may be configured in the configured storage block while the second function may be performed on the non-configured storage block in which the second function has been configured. The non-configured storage block may output the output data DOUT as a result of performing the second function.

The functional block FB may include three input ports to simultaneously receive the configuration selection signal CSEL, the configuration command signal CON_CMD, and the function command signal OP_CMD. However, example embodiments are not limited thereto, and the functional block FB may receive a signal that is a combination of the configuration selection signal CSEL, the configuration command signal CON_CMD, and the function command signal OP_CMD, via one input port.

Figure 2:
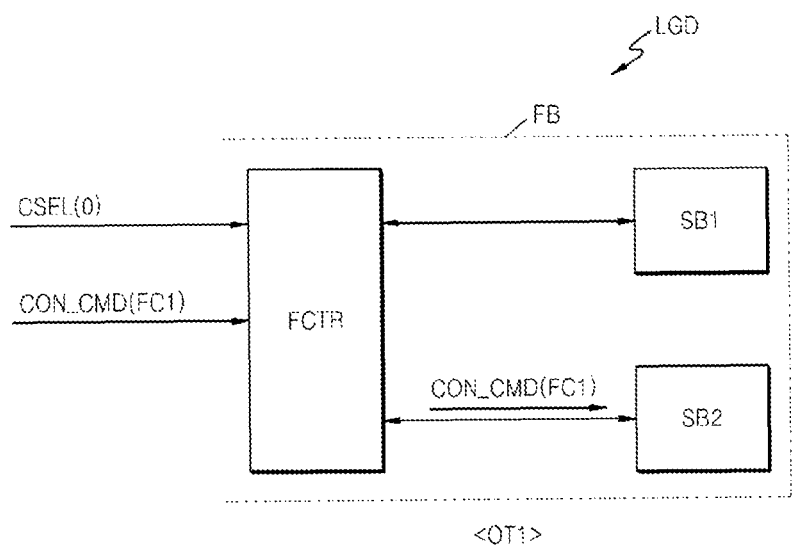
FIGS. 2 to 4 are block diagrams illustrating operations performed by the logic device of FIG. 1, according to an example embodiment.
Figure 3:
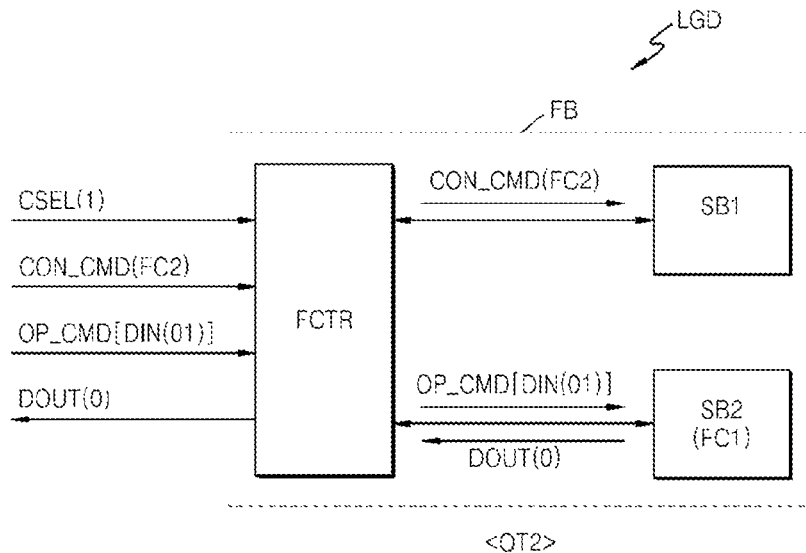
Figure 4:
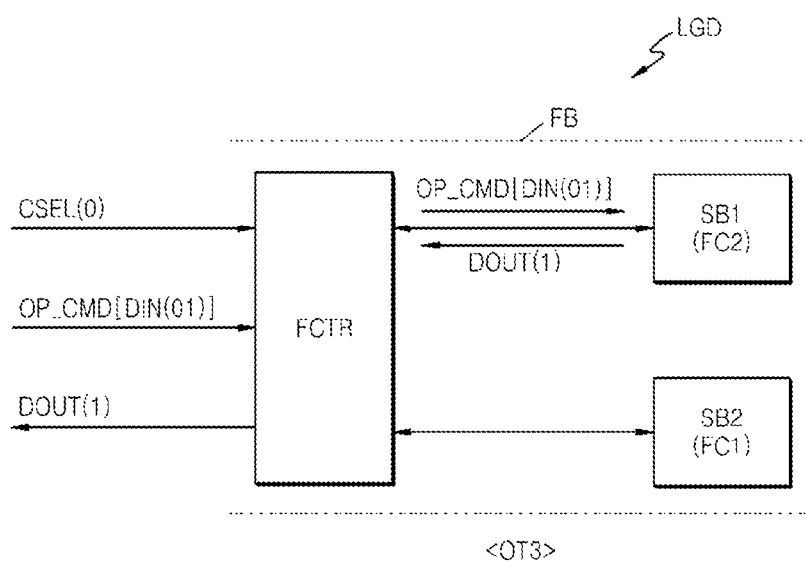

FIGS. 2 to 4 are block diagrams illustrating operations performed by the logic device LGD of FIG. 1, according to an example embodiment. FIGS. 2 to 4 illustrate operations performed by the logic device LGD in first to third operation time periods OT1 to OT3, respectively. An $(n+1)^{th}$ operation time period OTn+1 follows an $n^{th}$ operation time period OTn. In FIGS. 2 to 4, n denotes '1' or '2,' but may be an integer greater than 2. The logic device LGD may be idle between the $(n+1)^{th}$ operation time period OTn+1 and the $n^{th}$ operation time period OTn. For convenience of explanation, it is assumed that before the first operation time period OT1, no functions are configured in the first and second storage block SB1 and SB2.

Referring to FIG. 2, in the first operation time period OT1, the function controller FCTR of the logic device LGD receives a configuration selection signal CSEL that is '0', and a configuration command signal CON_CMD that instructs a first function FC1 be configured. The function controller FCTR may select the second storage block SB2 as a configured storage block and the first storage block SB1 as a non-configured storage block based on the configuration selection signal CSEL.

The function controller FCTR may configure the first function FC1 in the second storage block SB2 based on the configuration command signal CON_CMD. For example, the first function FC1 may be an AND function that is one of ALU functions. A first lookup table LUT1 corresponding to the first function FC1, i.e., the AND function, may be written to the second storage block SB2. Table 1 shows an example of the first lookup table LUT1 corresponding to the AND function.

TABLE 1

| LUT1 | |
|---|---|
| DIN | DOUT |
| 00 | 0 |
| 01 | 0 |
| 10 | 0 |
| 11 | 1 |

According to Table 1, the first lookup table LUT1 defines one-to-one correspondences between input data DIN that may be related to the AND function and output data DOUT.

Referring to FIG. 3 and the second operation time period OT2, the function controller FCTR receives the configuration selection signal CSEL '1', the configuration command signal CON_CMD that instructs a second function FC2 be configured, and a function command signal OP_CMD that includes input data DIN. It is assumed that the input data DIN is '01'. The function controller FCTR may select the first storage block SB1 as a configured storage block and the second storage block SB2 as a non-configured storage block, based on the configuration selection signal CSEL.

In the first operation time period OT1 of FIG. 2, the first function FC1 is configured in the second storage block SB2. Thus, the first function FC1 has already been configured in the second storage block SB2 in the second operation time period OT2.

In the second operation time period OT2, the function controller FCTR performs the first function FC1 on the second storage block SB2, based on the function command signal OP_CMD. If the first function FC1 is an AND function, then the function controller FCTR may perform the AND function on the input data DIN '01' included in the function command signal OP_CMD in the second storage block SB2. Then, output data DOUT that is '0' may be output as a result of the performing of the AND function.

The function controller FCTR configures the second function FC2 in the first storage block SB1, based on the configuration command signal CON_CMD. For example, the second function FC2 may be an OR function from among the ALU functions. A second lookup table LUT2 corresponding to the second function FC2 (the OR function), may be written to the first storage block SB1. Table 2 shows an example of the second lookup table LUT2 corresponding to the OR function.

TABLE 2

| LUT2 | |
|---|---|
| DIN | DOUT |
| 00 | 0 |
| 01 | 1 |
| 10 | 1 |
| 11 | 1 |

Referring to FIG. 4, in a third operation time period OT3, the function controller FCTR receives the configuration selection signal CSEL '0' and the function command signal OP_CMD that includes the input data DIN. It is assumed that the input data DIN is '01'. The function controller FCTR may select the second storage block SB2 as a configured storage block and the first storage block SB1 as a non-configured storage block based on the configuration selection signal CSEL.

In the second operation time period OT2 of FIG. 3, the second function FC2 is configured in the first storage block SB1. Thus, the second function FC2 has already been configured in the first storage block SB1 in the third operation time period OT3.

In the third operation time period OT3, the function controller FCTR performs the second function FC2 on the first storage block SB2, based on the function command signal OP_CMD. If the second function FC2 is an OR function, the function controller FCTR may perform the OR function on the input data DIN '01' included in the function command signal OP_CMD in the first storage block SB1. Then, output data DOUT '1' may be output as a result of the performing of the OR function.

FIG. 4 illustrates that the logic device LGD does not receive the configuration command signal CON_CMD but example embodiments are not limited thereto. For example, the logic device LGD may receive the configuration command signal CON_CMD that instructs a third function be configured and may reconfigure the third function in the second storage block SB2 in which the first function FC1 has been configured.

In FIGS. 3 and 4, the input data DIN included in the function command signal OP_CMD is a 2-bit signal, and the output data DOUT is a 1-bit signal, but the example embodiments are not limited thereto. The sizes of the input data DIN and the output data DOUT are not limited. Furthermore, the operations of the logic device LGD illustrated in FIGS. 2 to 4 are just illustrative examples, and the logic device LGD is not limited thereto.

The logic device LGD may configure a second function, which is to be performed in a subsequent operation time period, in a configured storage block that is selected from among the first storage block SB1 and the second storage block SB2 included in the functional block FB. The logic device LGD may perform a first function, which was configured in a previous operation time period, on a non-configured storage block, or the storage block that is not selected. In other words, configuring the second function and performing the first function may be simultaneously performed in the functional block FB.

According to related art, a functional block includes only one storage block, unlike an example embodiment in FIG. 1. In this case, if a second function needs to be performed on the functional block in which a first function has already been configured, then performing of the first function should be completed and then, configuring of the second function should be completed. Thus, it takes a relatively long time to perform the second function.

On the other hand, when the functional block FB includes two storage blocks SB1 and SB2 according to at least one example embodiment, as illustrated in FIG. 1, configuring the second function and performing the first function may be simultaneously performed. Thus, the second function may be performed right after the first function is performed. Accordingly, it may take a relatively short time to perform the second function and a response speed of the logic device LGD may be increased. Thus, according to at least one example embodiment, the overall performance of the logic device LGD may be enhanced.

Figure 5:
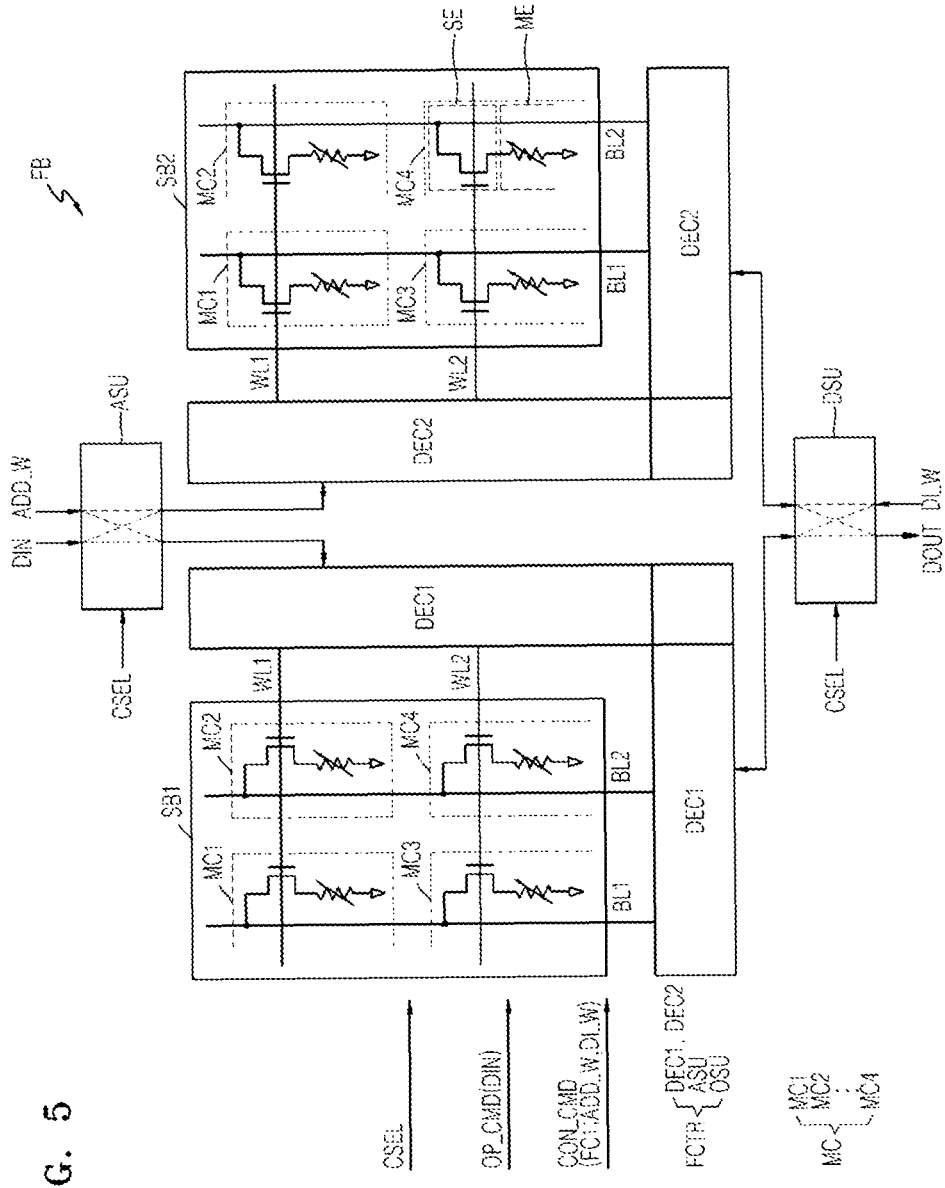
FIG. 5 is a circuit diagram of a functional block included in the logic device of FIG. 1, according to an example embodiment.

FIG. 5 is a circuit diagram of the functional block FB included in the logic device LGD of FIG. 1, according to at least one example embodiment. Referring to FIG. 5, the functional block FB includes the first storage block SB1, the second storage block SB2, and the function controller FCTR. Each of the first storage block SB1 and the second storage block SB2 may include a plurality of memory cells MC1 to MC4 that are arranged in a matrix. FIG. 5 illustrates that each of the storage blocks SB1 and SB2 includes four memory cells MC1 to MC4, but example embodiments are not limited thereto and the total number of memory cells that may be included in each of the storage blocks SB1 and SB2 is not limited.

Each of the plurality of memory cells MC1 to MC4 is connected to one of a plurality of word lines WL1 and WL2 and one of a plurality of bit lines BL1 and BL2. For example, the third memory cell MC3 is connected to the second word line WL2 and the first bit line BL1.

Each of the plurality of memory cells MC1 to MC4 may include a memory device ME and a switch device SE. The memory device ME of FIG. 5 is a resistive memory device, but is not limited thereto and may be include any of various storage devices.

The switch device SE may be a three-terminal device. In the switch device SE, a gate terminal may be connected to one of the word lines WL1 and WL2, a drain terminal may be connected to one of the bit lines BL1 and BL2, and a source terminal may be connected to the memory device ME. The plurality of memory cells MC1 to MC4 of each of the storage blocks SB1 and SB2 may be respectively identified using 2-bit addresses. For example, an address '00', an address '01', an address '10' and an address '11' may respectively indicate the first memory cell MC1, the second memory cell MC2, the third memory cell MC3, and the fourth memory cell MC4.

The function controller FCTR may include first and second decoders DEC1 and DEC2, an address selector ASU, and a data selector DSU.

The first decoder DEC1 may control the first storage block SB1, and the second decoder DEC2 may control the second storage block SB2. The first decoder DEC1 may access the first storage block SB1, and may write data to or read data from the first storage block SB1. The second decoder DEC2 may access the second storage block SB2, and may write data to or read data from the second storage block SB2.

The function controller FCTR may receive a configuration selection signal CSEL, a configuration command signal CON_CMD that instructs a first function FC1 be configured, and a function command signal OP_CMD. The configuration command signal CON_CMD may include write address ADD_W and write data DI_W to configure the first function FC1. The function command signal OP_CMD may include input data DIN.

The address selector ASU transmits the input data DIN to one of the first decoder DEC1 and the second decoder DEC2 and transmits the write address ADD_W to the other decoder based on the configuration selection signal CSEL.

The data selector DSU transmits the write data DI_W to one of the first decoder DEC1 and the second decoder DEC2 and outputs output data DOUT received from the other decoder based on the configuration selection signal CSEL.

For example, it is assumed that a configured storage block is the second storage block SB2 and a non-configured storage block is the first storage block SB1.

The address selector ASU transmits the write address ADD_W to the second decoder DEC2, and the data selector DSU transmits the write data DI_W to the second decoder DEC2. The second decoder DEC2 accesses a memory cell indicated by the write address ADD_W and writes the write data DI_W to the memory cell, thereby configuring the first function FC1 in the second storage block SB2.

Table 3 shows examples of memory cells indicated by the write address ADD_W, the write data DI_W, and the write address ADD_W when the first function FC1 is an AND function. Table 3 is the same as the first lookup table LUT1 corresponding to the AND function illustrated in Table 1. In other words, when configuring the first function FC1 in the second storage block SB2 ends, the first lookup table LUT1 may be stored in the second storage block SB2.

TABLE 3

| ADD_W | DI_W | MC |
|---|---|---|
| 00 | 0 | MC1 |
| 01 | 0 | MC2 |
| 10 | 0 | MC3 |
| 11 | 1 | MC4 |

The address selector ASU transmits the input data DIN to the first decoder DEC1. The input data DIN may be a read address indicating a memory cell. The first decoder DEC1 accesses the memory cell indicated by the input data DIN and reads data from the memory cell. The data read by the first decoder DEC1 is transmitted to the data selector DSU, and the data selector DSU outputs the read data as output data DOUT.

If a second lookup table LUT2 corresponding to an OR function (see Table 2) is stored in the first storage block SB1 and the input data DIN is '10', the first decoder DEC1 may access the third memory cell MC3 of the first storage block SB1 and read data from the third memory cell MC3. Since '1' is stored in the third memory cell MC3, output data DOUT '1' may be output.

Figure 6:
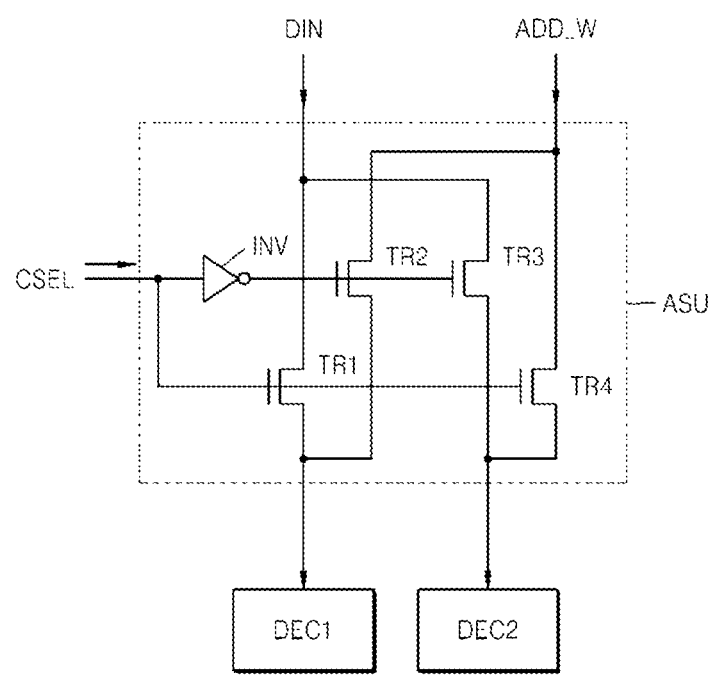
FIG. 6 is a circuit diagram of an address selector included in the functional block of FIG. 5, according to an example embodiment.

FIG. 6 is a circuit diagram of an address selector included in the functional block FB of FIG. 5, according to at least one example embodiment. Referring to FIG. 6, the address selector ASU includes an inverter INV and a plurality of transistors TR1 to TR4.

A configuration selection signal CSEL may be applied to a gate terminal of the first transistor TR1 and a gate terminal of the fourth transistor TR4. The configuration selection signal CSEL may be applied to a gate terminal of the second transistor TR2 and a gate terminal of the third transistor TR3 via the inverter INV. Thus, when the first transistor TR1 and the fourth transistor TR4 are turned on, the second transistor TR2 and the third transistor TR3 are turned off, and vice versa.

Input data DIN may be applied to a drain terminal of the first transistor TR1, and a source terminal of the first transistor TR1 is connected to the first decoder DEC1. A write address ADD_W may be applied to a drain terminal of the fourth transistor TR4, and a source terminal of the fourth transistor TR4 is connected to the second decoder DEC2. Thus, if the first transistor TR1 and the fourth transistor TR4 are turned on based on the configuration selection signal CSEL, the input data DIN is applied to the first decoder DEC1 and the write address ADD_W is applied to the second decoder DEC2.

The write address ADD_W may be applied to a drain terminal of the second transistor TR2, and a source terminal of the second terminal TR2 is connected to the first decoder DEC1. The input data DIN may be applied to a drain terminal of the third transistor TR3, and a source terminal of the third transistor TR3 is connected to the second decoder DEC2. Thus, when the second transistor TR2 and the third transistor TR3 are turned on based on an inverted signal of the configuration selection signal CSEL, the input data DIN is applied to the second decoder DEC2 and the write address ADD_W is applied to the first decoder DEC1.

Figure 7:
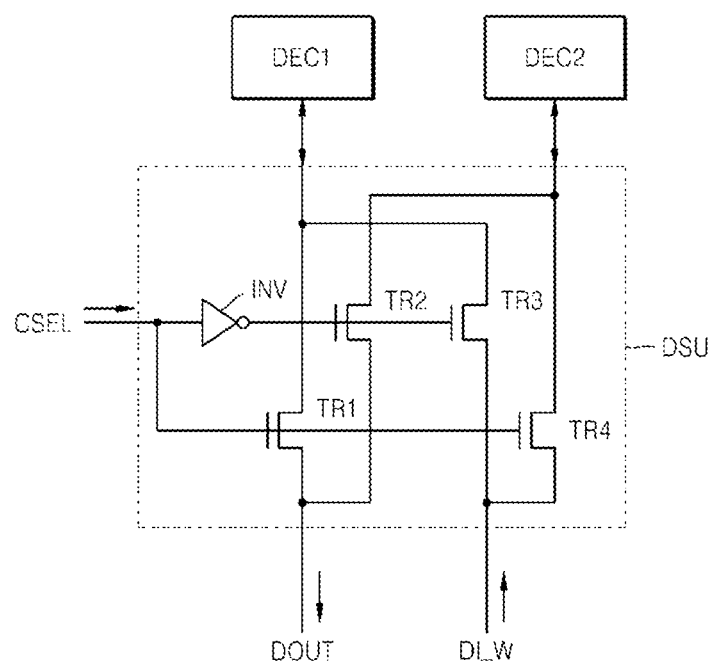
FIG. 7 is a circuit diagram of a data selector included in the functional block of FIG. 5, according to an example embodiment.

FIG. 7 is a circuit diagram of the data selector DSU included in the functional block FB of FIG. 5, according to at least one example embodiment. Referring to FIG. 7, the data selector DSU includes an inverter INV and a plurality of transistors TR1 to TR4. The data selector DSU may have the same structure as that of the address selector ASU of FIG. 6, except for a signal DI_W input to the data selector DSU and an output signal DOUT output from the data selector DSU. Thus, a description of the data selector DSU that is the same as that of the address selector ASU of FIG. 6 will not be provided again here.

When the first transistor TR1 and the fourth transistor TR4 are turned on based on the configuration selection signal CSEL, the data selector DSU transmits a write data DI_W to the second decoder DEC2 and receives output data DOUT from the first decoder DEC1. When the second transistor TR2 and the third transistor TR3 are turned on based on an inverted signal of the configuration selection signal CSEL, the data selector DSU transmits the write data DI_W to the first decoder DEC1 and receives output data DOUT from the second decoder DEC2.

Figure 8:
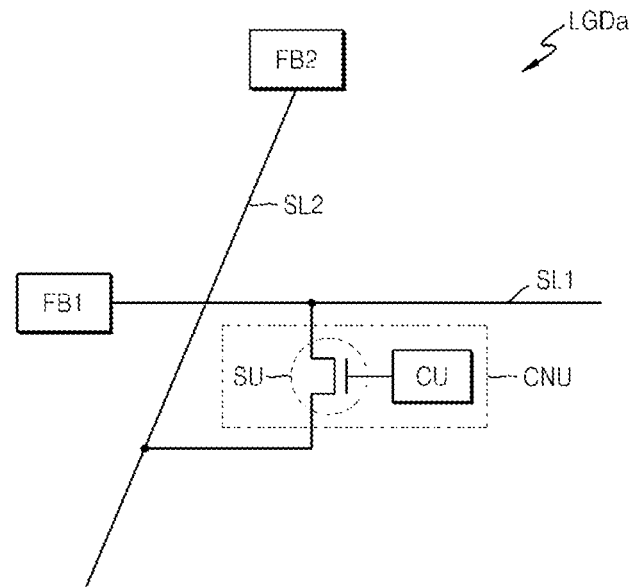
FIG. 8 is a block diagram of a logic device according to another example embodiment.

FIG. 8 is a block diagram of a logic device LGDa according to at least one other example embodiment. Referring to FIG. 8, the logic device LGDa includes a plurality of functional blocks FB1 and FB2, a plurality of signal lines SL1 and SL2, and a connection unit CNU. The functional blocks FB1 and FB2 of FIG. 8 may be the same as the functional block FB of FIG. 1.

The first signal line SL1 may be connected to the first functional block FB1, and the second signal line SL2 may be connected to the second functional block FB2.

The connection unit CNU is connected between the first signal line SL1 and the second signal line SL2. The connection unit CNU controls a connection between the first signal line SL1 and the second signal line SL2. Thus, the connection unit CNU may be used to connect the first functional block FB1 and the second functional block FB2 to each other or to disconnect them from each other.

The connection unit CNU may include a switch unit SU and a configuration unit CU. The switch unit SU is connected between the first signal line SL1 and the second signal line SL2. The configuration unit CU controls the switch unit SU to be turned on or off.

Figure 9:
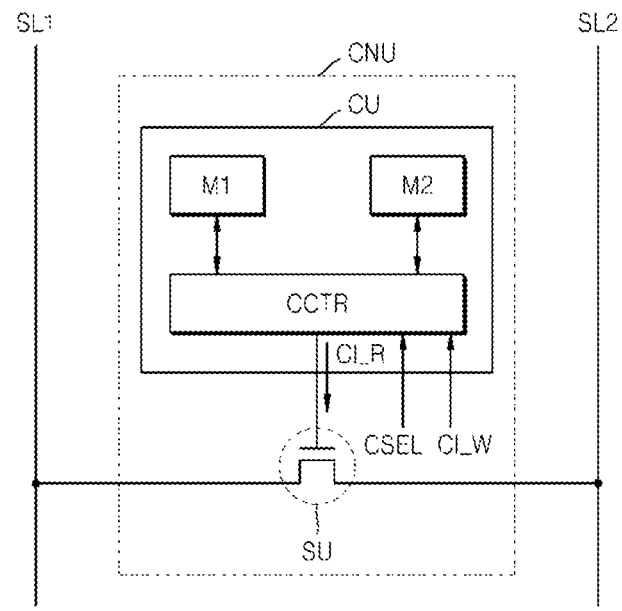
FIG. 9 illustrates a connection unit included in the logic device of FIG. 8, according to an example embodiment.

FIG. 9 illustrates the connection unit CU included in the logic device LGDa of FIG. 8, according to at least one example embodiment. Referring to FIG. 9, the connection unit CNU includes the switch unit SU and the configuration unit CU. The configuration unit CU may include a first memory device M1, a second memory device M2, and a connection controller CCTR.

The connection controller CCTR may receive a configuration selection signal CSEL and write connection information CI_W, and may output read connection information CI_R.

The connection controller CCTR may select one of the first memory device M1 and the second memory device M2 as a configured memory device based on the configuration selection signal CSEL. For example, the first memory device M1 may be selected as the configured memory device when the configuration selection signal CSEL is '1', and the second memory device M2 may be selected as the configured memory device when the configuration selection signal CSEL is '0'. The configuration selection signal CSEL of FIG. 9 may be the same as the configuration selection signal CSEL applied to the functional block FB in FIG. 1.

Hereinafter, a memory device selected from among the first memory device M1 and the second memory device M2 according to the configuration selection signal CSEL, will be referred to as a 'configured memory device', and the other memory device that is not selected will be referred to as a 'non-configured memory device'.

The connection controller CCTR may store write connection information CI_W in one of the first memory device M1 and the second memory device M2, which is the configured memory device. The connection controller CCTR may also control the switch unit SU to be turned on or off based on read connection information CI_R read from the non-configured memory device. For example, if the read connection information CI_R is '1', then the switch unit SU may be turned on to connect the first signal line SL1 and the second signal line SL2 to each other. If the read connection information CI_R is '0', then the switch unit SU may be turned off, and thus, the first signal line SL1 and the second signal line SL2 may not be connected to each other.

Figure 10:
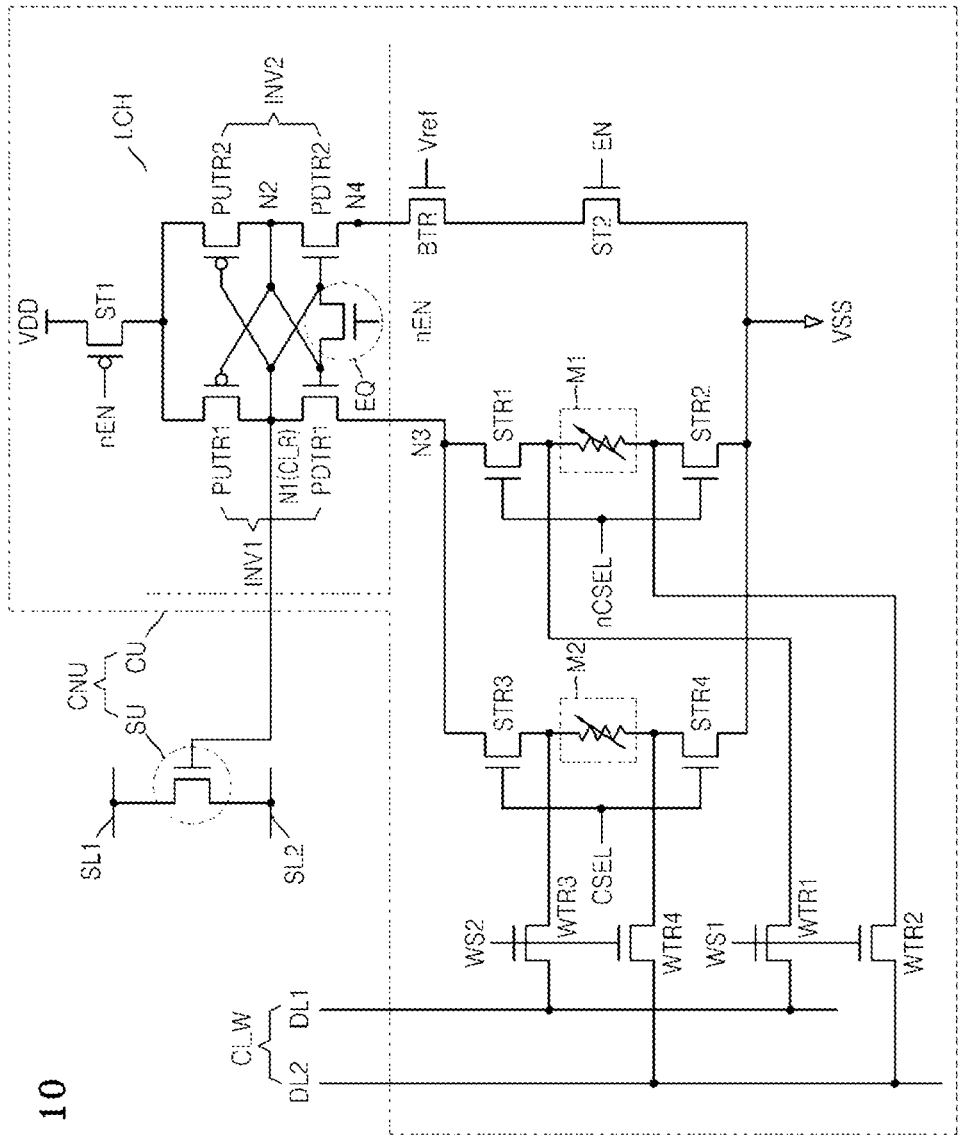
FIG. 10 is an example circuit diagram of the connection unit of FIG. 9.

FIG. 10 is an example circuit diagram of the connection unit CNU of FIG. 9. Referring to FIG. 10, the connection unit CNU includes the switch unit SU and the configuration unit CU. The configuration unit CU includes the first memory device M1, the second memory device M2, and the connection controller CCTR of FIG. 9 that controls the first and second memory devices M1 and M2. The first and second memory devices M1 and M2 of FIG. 10 are resistive memory devices but are not limited thereto and may include various other storage devices.

A gate terminal of the switch unit SU is connected to a first node N1 of the configuration unit CU. Thus, the switch unit SU is controlled to be turned on or off, based on voltage of the first node N1. The voltage of the first node N1 may correspond to read connection information CI_R read from the non-configured memory device.

The connection controller CCTR of FIG. 9 may include a plurality of write transistors WTR1 to WTR4, a plurality of selection transistors STR1 to STR4, a latch LCH, a bias transistor BTR, and a plurality of switch transistors ST1 and ST2.

The first write transistor WTR1 is connected between the first data line DL1 and one end of the first memory device M1, and is controlled to be turned on or off based on a first write signal WS1. The second write transistor WTR2 is connected to the second data line DL2 and another end of the first memory device M1, and is controlled to be turned on or off based on the first write signal WS1.

The third write transistor WTR3 is connected between the first data line DL1 and one end of the second memory device M2, and is controlled to be turned on or off based on a second write signal WS2. The fourth write transistor WTR4 is connected between the second data line DL2 and another end of the second memory device M2, and is controlled to be turned on or off based on the second write signal WS2.

When the first and second write transistors WTR1 and WTR2 are turned on according to the first write signal WS1, write connection information CI_W transmitted via the data lines DL1 and DL2 may be written to the first memory device M1. When the third and fourth write transistors WTR3 and WTR4 are turned on according to the second write signal WS2, the write connection information CI_W transmitted via the data lines DL1 and DL2 may be written to the second memory device M2.

If the first memory device M1 is a configured memory device, the first and second write transistors WTR1 and WTR2 may be turned on according to the first write signal WS1. If the first memory device M1 is the configured memory device, then the second memory device M2 is a non-configured memory device, and thus, the third and fourth write transistors WTR3 and WTR4 may be turned off according to the second write signal WS2.

If the second memory device M2 is a configured memory device, the third and fourth write transistors WTR3 and WTR4 may be turned on according to the second write signal WS2. If the second memory device M2 is the configured memory device, then the first memory device M1 is a non-configured memory device. Thus, the first and second write transistors WTR1 and WTR2 may be turned off according to the first write signal WS1. Thus, the second write signal WS2 may be an inverted signal of the first write signal WS1.

The first memory device M1 is connected between the first selection transistor STR1 and the second selection transistor STR2. The second memory device M2 is connected between the third selection transistor STR3 and the fourth selection transistor STR4.

An inversed configuration selection signal nCSEL, which is an inversed signal of the configuration selection signal CSEL, may be applied to gate terminals of the first and second selection transistors STR1 and STR2. The configuration selection signal CSEL may be applied to gate terminals of the third and fourth selection transistors STR3 and STR4. For example, if the configuration selection signal CSEL is '1', then the first and second selection transistors STR1 and STR2 may be turned off and the third and fourth selection transistors STR3 and STR4 may be turned on. If the configuration selection signal CSEL is '0', then the first and second selection transistors STR1 and STR2 may be turned on and the third and fourth selection transistors STR3 and STR4 may be turned off.

A drain terminal of the first selection transistor STR1 and a drain terminal of the third selection transistor STR3 may be connected to the latch LCH via a third node N3. A ground voltage VSS may be applied to a source terminal of the second selection transistor STR2 and a source terminal of the fourth selection transistor STR4.

According to at least one example embodiment, if the configuration selection signal CSEL is '1', then the first memory device M1 is selected as a configured memory device. The first and second selection transistors STR1 and STR2 are turned off. Thus, the first memory device M1 is not connected to the latch LCH and the ground voltage VSS is not applied to the first memory device M1. The first and second write transistors WTR1 and WTR2 are turned on according to the first write signal WS1, and the write connection information CI_W transmitted via the data lines DL1 and DL2 may be written to the first memory device M1. However, the third and fourth selection transistors STR3 and STR4 connected to the second memory device M2, the non-configured memory device, are turned on. Accordingly, one end of the second memory device M2 may be connected to the latch LCH via the third node N3, and the ground voltage VSS may be applied to another end of the second memory device M2.

The latch LCH may include a first inverter INV1 and a second inverter INV2.

The first inverter INV1 may include a first pull-up transistor PUTR1 and a first pull-down transistor PDTR1. The first pull-up transistor PUTR1 and the first pull-down transistor PDTR1 are connected in series. The first node N1 is located between the first pull-up transistor PUTR1 and the first pull-down transistor PDTR1.

The second inverter INV2 may include a second pull-up transistor PUTR2 and a second pull-down transistor PDTR2. The second pull-up transistor PUTR2 and the second pull-down transistor PDTR2 may be connected in series. The second node N2 is located between the second pull-up transistor PUTR2 and the second pull-down transistor PDTR2.

Specifically, the first pull-up transistor PUTR1 of the first inverter INV1 may include a P type transistor having a source terminal connected to the first switch transistor ST1, a drain terminal connected to the first node N1, and a gate terminal connected to a second node N2. The first pull-down transistor PDTR1 of the first inverter INV1 may include an N type transistor having a source terminal connected to the third node N3, a drain terminal connected to the first node N1, and a gate terminal connected to the second node N2.

The second pull-up transistor PUTR2 of the second inverter INV2 may include a P type transistor having a source terminal connected to the first switch transistor ST1, a drain terminal connected to the second node N2, and a gate terminal connected to the first node N1. The second pull-down transistor PDTR2 may include an N type transistor having a source terminal connected to the bias transistor BTR via a fourth node N4, a drain terminal connected to the second node N2, and a gate terminal connected to the first node N1.

The gate terminals of the first pull-up transistor PUTR1 and the first pull-down transistor PDTR1 are connected to the second node N2, and the gate terminals of the second pull-up transistor PUTR2 and the second pull-down transistor PDTR2 are connected to the first node N1. Thus, the first inverter INV1 and the second inverter INV2 may be cross-linked to each other, thus forming the latch LCH.

The latch LCH may further include an equalizer EQ. The equalizer EQ may control a connection between the first and second nodes N1 and N2 based on an inversed enable signal nEN, which is an inversed signal of an enable signal EN. If the equalizer EQ is turned on to connect the first node N1 and the second node N2, then the gate terminal of the first pull-up transistor PUTR1 is connected to the drain terminal of the first pull-up transistor PUTR1. Thus, the first pull-up transistor PUTR1 is turned on. Further, each of the second pull-up transistor PUTR2, and the first and second pull-down transistors PDTR1 and PDTR2 is turned on likewise.

The first switch transistor ST1 may control a power supply voltage VDD to be applied to or not to be applied to the latch LCH, based on the inversed enable signal nEN. The second switch transistor ST2 may control the ground voltage VSS to be applied to or not to be applied to the bias transistor BTR based on the enable signal EN.

When the first and second switch transistors ST1 and ST2 are turned on based on the enable signal EN and the inversed enable signal nEN, the power supply voltage VDD may be applied to the latch LCH, thus operating the latch LCH. In this case, the equalizer EQ is turned off.

When the first and second switch transistors ST1 and ST2 are turned off based on the enable signal EN and the inversed enable signal nEN, the power supply voltage VDD is not applied to the latch LCH, and thus, the latch LCH does not operate. In this case, the equalizer EQ is turned on to connect the first node N1 and the second node N2.

The bias transistor BTR is connected between the fourth node N4, which is connected to the latch LCH, and the second switch transistor ST2. A reference voltage Vref may be applied to a gate terminal of the bias transistor BTR. The bias transistor BTR may act as a resistor. The reference voltage Vref may be set to compare a resistance value of the bias transistor BTR with resistance values stored in the first and second memory devices M1 and M2.

For example, it is assumed that a low resistance value, e.g., 1 kΩ, is stored in the first or second memory devices M1 or M2 when the write connection information CI_W is '0' (denoting non-connection), and a high resistance value, e.g., 1 MΩ, is stored in the first or second memory devices M1 or M2 when the write connection information CI_W is '1' (denoting connection). The reference voltage Vref may be set in such a manner that the bias transistor BTR may have a resistance value between the high resistance value and the low resistance value, e.g., 50 kΩ. The bias transistor BTR may be replaced with a passive resistor.

Hereinafter, it is assumed that for convenience of explanation the configuration selection signal CSEL is '1', the first memory device M1 is a configured memory device, and the second memory device M2 is a non-configured memory device.

The first and second selection transistors STR1 and STR2 are turned off and the third and fourth selection transistors STR3 and STR4 are turned on. One end of the second memory device M2 is connected to the third node N3, and the ground voltage VSS is applied to another end of the second memory device M2.

In the second memory device M2, either a high resistance value denoting connection or a low resistance value denoting non-connection may be stored.

First, the first and second switch transistors ST1 and ST2 are turned off and the equalizer EQ is turned on, based on the enable signal EN. When the equalizer EQ is turned on, all of the first and second pull-up transistors PUTR1 and PUTR2 and the first and second pull-down transistors PDTR1 and PDTR2 are turned on.

Next, the first and second switch transistors ST1 and ST2 are turned on and the equalizer EQ are turned off based on the enable signal EN.

When a high resistance value that denotes connection is stored in the second memory device M2, a voltage of the third node N3 is higher than that of the fourth node N4. When a low resistance value that denotes non-connection is stored in the second memory device M2, the voltage of the third node N3 is lower than that of the fourth node N4.

All of the first and second pull-up transistors PUTR1 and PUTR2 and the first and second pull-down transistors PDTR1 and PDTR2 are turned on before the equalizer EQ is turned off. Thus, after the equalizer EQ is turned off, the voltage of the third node N3 may be applied to the first node N1 via the first pull-down transistor PDTR1 and the voltage of the fourth node N4 may be applied to the second node N2 via the second pull-down transistor PDTR2.

When a high resistance value that denotes connection is stored in the second memory device M2, a voltage of the first node N1 is higher than that of the second node N2. Thus, the first pull-up transistor PUTR1 and the second pull-down transistor PDTR2 are turned on, the second pull-up transistor PUTR2 and the first pull-down transistor PDTR1 are turned off, and the voltage of the first node N1 is higher than that of the second node N2. The higher voltage of the first node N1 corresponds to read connection information CI_R read from the second memory device M2. The higher voltage of the first node N1 allows the switch unit SU to be turned on, and thus, the first signal line SL1 and the second signal line SL2 are connected to each other.

When a low resistance value that denotes non-connection is stored in the second memory device M2, the voltage of the first node N1 is lower than that of the second node N2. Thus, the second pull-up transistor PUTR2 and the first pull-down transistor PDTR1 are turned on, the first pull-up transistor PUTR1 and the second pull-down transistor PDTR2 are turned off, and the voltage of the first node N1 is lower than that of the second node N2. The lower voltage of the first node N1 corresponds to the read connection information CI_R read from the second memory device M2. The lower voltage of the first node N1 allows the switch unit SU to be turned off, and thus, the first signal line SL1 and the second signal line SL2 are not connected to each other.

In at least this example embodiment, it is assumed that the configuration selection signal CSEL is '1'. If the configuration selection signal CSEL is '0', the first memory device M1 is a non-configured memory device, and the second memory device M2 is a configured memory device, a method of operating the connection unit CNU will be obvious to those of ordinary skill in the art, and thus, will not be described here.

Figure 11:
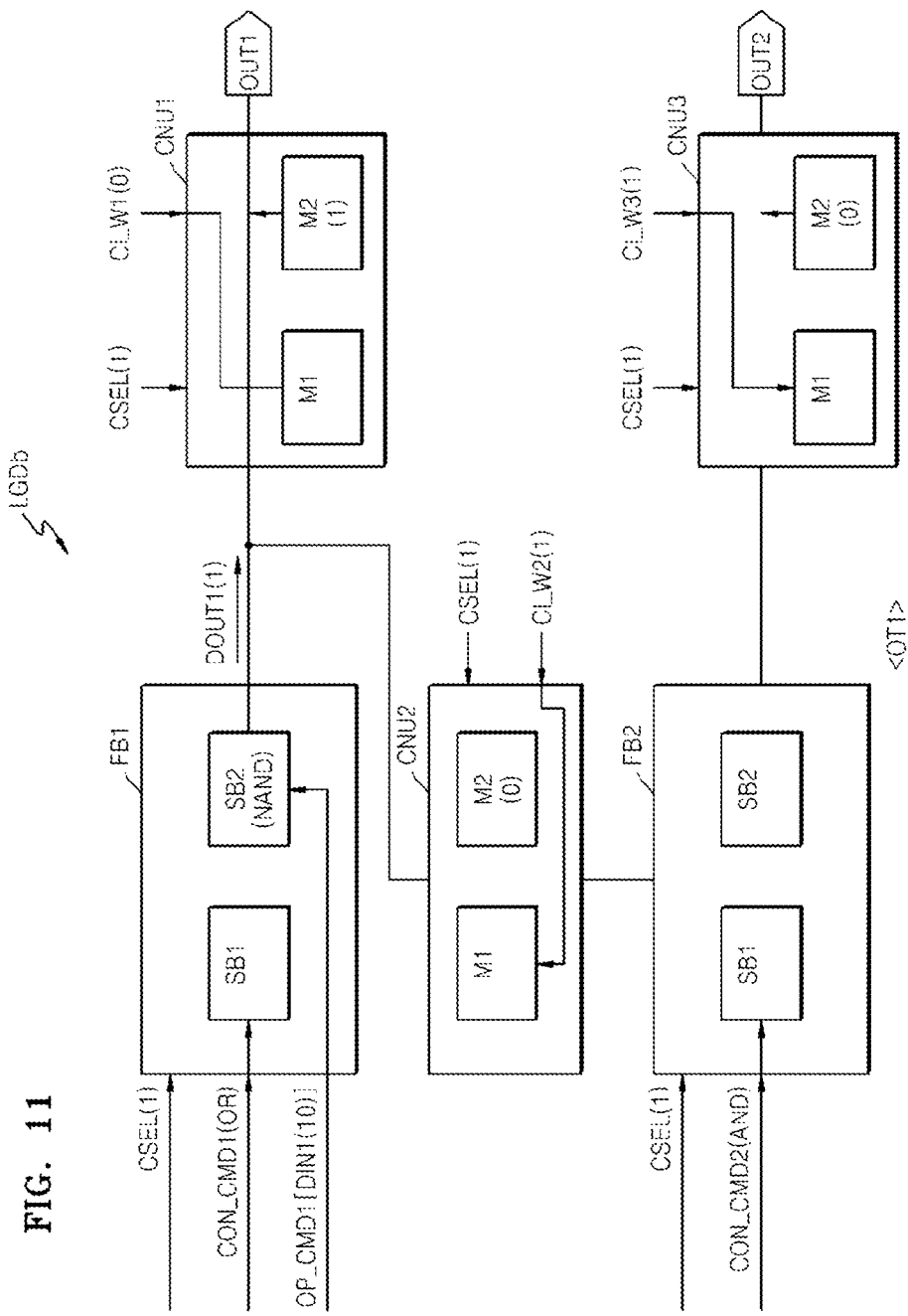
FIGS. 11 and 12 are block diagrams illustrating operations performed by a logic device, according to another example embodiment.
Figure 12:
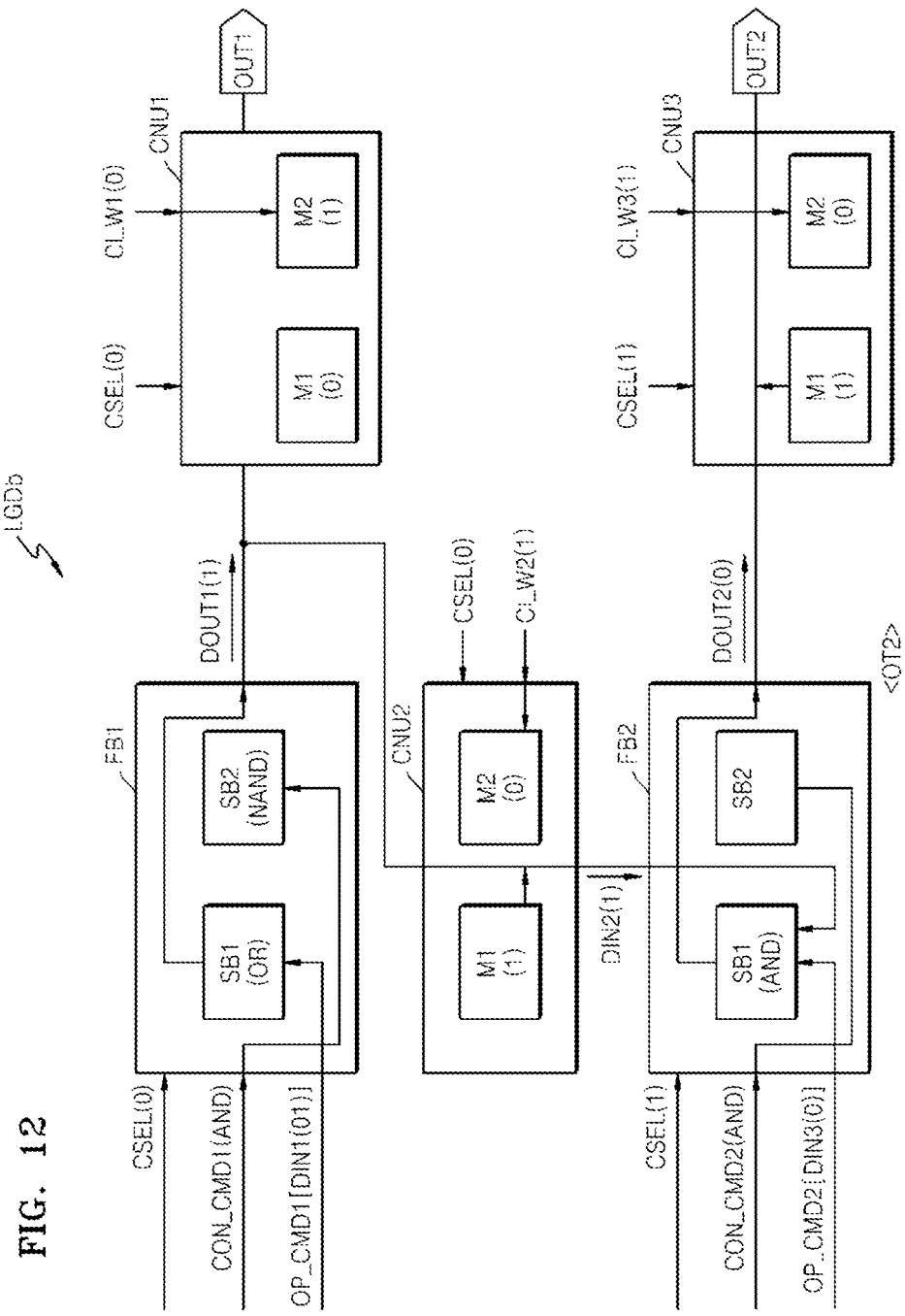

FIGS. 11 and 12 are block diagrams illustrating operations performed by a logic device LGDb, according to at least one other example embodiment. FIGS. 11 and 12 illustrate operations performed by the logic device LGDb in a first operation time period OT1 and a second operation time period OT2, respectively.

Referring to FIGS. 11 and 12, the logic device LGDb includes a plurality of functional blocks FB1 and FB2 and a plurality of connection units CNU1 to CNU3. The logic device LGDb may include a plurality of output terminals OUT1 and OUT2. Although not shown in FIGS. 11 and 12, the logic device LGDb may further include an input terminal. Otherwise, the logic device LGDb may include an input/output terminal.

The first connection unit CNU1 controls a connection between the first functional block FB1 and the first output terminal OUT1. The second connection unit CNU2 controls a connection between the first functional block FB1 and the second functional block FB2. The third connection unit CNU3 controls a connection between the second functional block FB2 and the second output terminal OUT2.

Each of the first and second functional blocks FB1 and FB2 includes a first storage block SB1 and a second storage block SB2. Each of the first to third connection units CNU1 to CNU3 includes a first memory device M1 and a second memory device M2. For convenience of illustration, the function controller FCTR of FIG. 1, which may be included in each of the first and second functional blocks FB1 and FB2, and the switch unit SU and the connection controller CCTR of FIG. 9, which may be included in each of the first to third connection units CNU1 to CNU3, are not illustrated in FIGS. 11 and 12.

The first and second functional blocks FB1 and FB2 may be the same as the functional block FB of FIG. 1, and the first to third connection units CNU1 to CNU3 may be the same as the connection unit CNU of FIG. 9.

Referring to FIG. 11, in the first operation time period OT1, the logic device LGDb may receive a configuration selection signal CSEL that is '1.' As a result, the first storage block SB1 of each of the first and second functional blocks FB1 and FB2 may be selected as a configured storage block, and the first memory device M1 of each of the connection units CNU1 to CNU3 may be selected as a configured memory device.

In the first operation time period OT1, '1' (denoting connection) may be stored in the second memory device M2 of the first connection unit CNU1, and thus, the first functional block FB1 and the first output terminal OUT1 are connected. The first connection unit CNU1 may receive first write connection information CI_W1 '0' (denoting non-connection), and store it in the first memory device M1.

In the first operation time period OT1, '0' (denoting non-connection) is stored in the second memory device M2 of the second connection unit CNU2, and the first functional block FB1 and the second functional block FB2 are not connected to each other. The second connection unit CNU2 receives second write connection information CI_W2 '1' (denoting connection), and stores it in the first memory device M1.

In the first operation time period OT1, '0' (denoting non-connection) is stored in the second memory device M2 of the third connection unit CNU3, and the second functional block FB2 and the second output terminal OUT2 are not connected. The third connection unit CNU3 receives third write connection information CI_W3 '1' (denoting connection), and stores it in the first memory device M1.

In the first operation time period OT1, the first functional block FB1 receives a first configuration command signal CON_CMD1 instructing an OR function be configured, and receives a first function command signal OP_CMD1 which includes first input data DIN1 '10'.

In the first operation time period OT1, the first storage block SB1 is selected as a configured storage block, and the OR function is configured in the first storage block SB1 of the first functional block FB1.

For the sake of explanation, i assume a NAND function is configured in the second storage block SB2 of the first functional block FB1 before the first operation time period OT1. Thus, the NAND function is performed on the first input data DIN1 '10' in the second storage block SB2. First output data DOUT1 '1' is output as a result of the performing of the NAND function from the first functional block FB1. The first output data DOUT1 '1' is provided to the first connection unit CNU1 and the second connection unit CNU2.

In the first operation time period OT1, the first functional block FB1 is connected to the first output terminal OUT1 and is not connected to the second functional block FB2. Thus, the first output data DOUT1 '1' is provided to the first output terminal OUT1.

In the first operation time period OT1, the second functional block FB2 receives a second configuration command signal CON_CMD2 instructing an AND function be configured. Thus, the AND function is configured on the first storage block SB1 of the second functional block FB2.

Referring to FIG. 12, in the second operation time period OT2, the logic device LGDb may receive a configuration selection signal CSEL '0', select the second storage block SB2 of each of the first and second functional blocks FB1 and FB2 as a configured storage block, and select the second memory device M2 of each of the first to third connection units CNU1 to CNU3 as a configured memory device.

In the second operation time period OT2, '0' (denoting non-connection and stored in the first operation time period OT1) is stored in the first memory device M1 of the first connection unit CNU1. Thus, the first functional block FB1 and the first output terminal OUT1 are not connected to each other. The first connection unit CNU1 receives first write connection information CI_W1 '0' (denoting non-connection), and updates the second memory device M2 from '1' (denoting connection) to '0' (denoting non-connection).

In the second operation time period OT2, '1' (denoting connection and stored in the first operation time period OT1) is stored in the first memory device M1 of the second connection unit CNU2. Thus, the first functional block FB1 and the second functional block FB2 are connected to each other. The second connection unit CNU2 receives second write connection information CI_W2 '1' (denoting connection), and updates the second memory device M2 from '0' (denoting non-connection) to '1' (denoting connection).

In the second operation time period OT2, '1' (denoting connection stored in the first operation time period OT1) is stored in the first memory device M1 of the third connection unit CNU3. Thus, the second functional block FB2 and the second output terminal OUT2 are connected to each other. The third connection unit CNU3 receives third write connection information CI_W3 '1' (denoting connection), and updates the second memory device M2 from '0' (denoting non-connection) to '1' (denoting connection).

In the second operation time period OT2, the first functional block FB1 receives first configuration command signal CON_CMD1 that instructs an AND function be configured, and receives a first function command signal OP_CMD1 that includes first input data DIN1 '01'.

In the second operation time period OT2, the second storage block SB2 is selected as a configured storage block, and the AND function is reconfigured instead of the NAND function in the second storage block SB2 of the first functional block FB1.

In the first operation time period OT1 of FIG. 11, the OR function has already been configured in the first storage block SB1 of the first functional block FB1. Thus, during the second operation time period OT2, the OR function is performed on the first input data DIN1 that is '01' in the first storage block SB1 of the first functional block FB1. First output data DOUT1 '1' is output as a result of the performing of the OR function from the first functional block FB1. The first output data DOUT1 '1' is provided to the first connection unit CNU1 and the second connection unit CNU2.

In the second operation time period OT2, the first functional block FB1 is not connected to the first output terminal OUT1 but is connected to the second functional block FB2. Thus, the first output data DOUT1 '1' is provided to the second functional block FB2. The first output data DOUT1 may be referred to as 'second input data DIN2' since it is input to the second functional block FB2. The second input data DIN2 may be transmitted to the first storage block SB1 that is a non-configured storage block of the second functional block FB2.

In the second operation time period OT2, the second functional block FB2 receives a second configuration command signal CON_CMD2 that instructs a NOR function be configured, and receives a second function command signal OP_CMD2 including third input data DIN3 '0'.

In the second operation time period OT2, the second storage block SB2 is selected as the configured storage block, and thus, the NOR function is configured in the second storage block SB2 of the second functional block FB2.

In the first operation time period OT1 of FIG. 11, the AND function has been configured in the first storage block SB1 of the second functional block FB2. Thus, during the second operation time period OT2, the AND function is performed on the second input data DIN2 '1' and the third input data DIN3 '0', in the first storage block SB1 of the second functional block FB2. Then, second output data DOUT2 '0' is output as a result of the performing of the AND function from the second functional block FB2.

In the second operation time period OT2, the second functional block FB2 is connected to the second output terminal OUT2. Thus, the second output data DOUT2 '0' is provided to the second output terminal OUT2.

Figure 13:
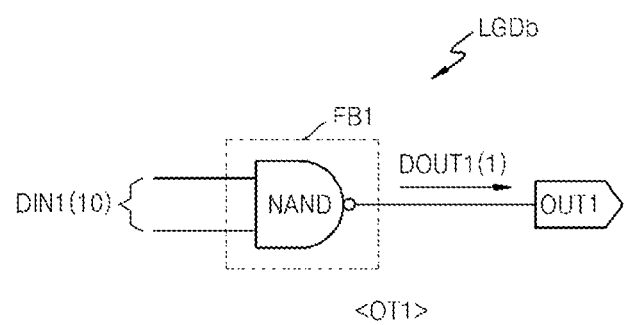
FIGS. 13 and 14 respectively illustrate the logic device of FIG. 11 and the logic device of FIG. 12 by using logic gates, according to at least one example embodiment.
Figure 14:
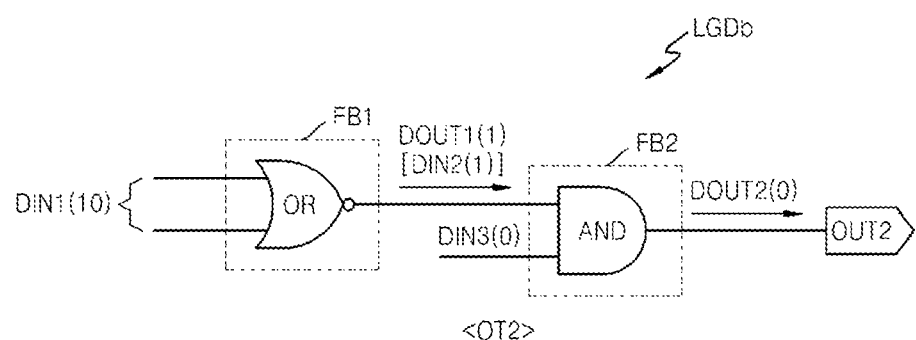

FIGS. 13 and 14 respectively illustrate the logic device LGDb of FIG. 11 and the logic device LGDb of FIG. 12 by using logic gates, according to at least one example embodiment.

Referring to FIGS. 11 and 13, in the first operation time period OT1, the logic device LGDb operates as a NAND gate by using the first functional block FB1. The logic device LGDb performs the NAND function on the first input data DIN1 '10' and outputs the first output data DOUT1 '1' via the first output terminal OUT1.

Referring to FIGS. 12 and 14, in the second operation time period OT2, the logic device LGDb operates as a logic circuit that is a combination of an OR gate and an AND gate by using the first functional block FB1 and the second functional block FB2. The logic device LGDb performs a logic function on the first input data DIN1 '10' and the third input data DIN3 '0' and outputs the second output data DOUT2 '0' via the second output terminal OUT2.

Thus far, various example embodiments have been described with respect to a logic device with one or two functional blocks, but a logic device according to another example embodiment may include more than two functional blocks. If a logic device includes more than two functional blocks, the logic device may be configured to perform not only simple logic functions but also complicated functions.

Figure 15:
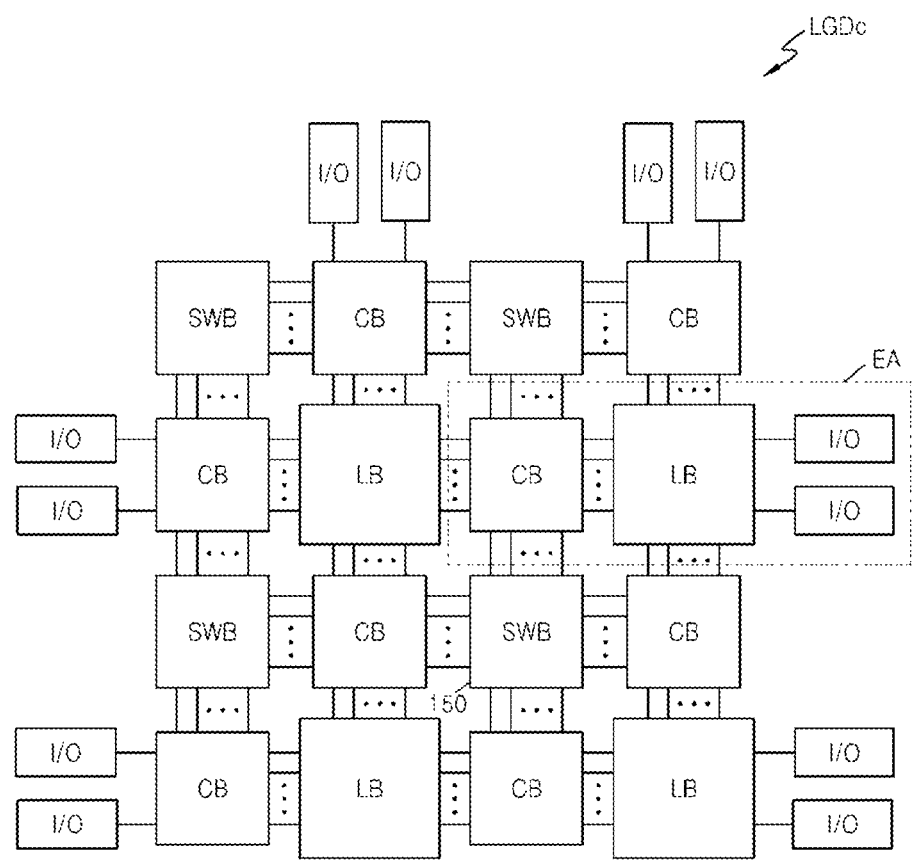
FIG. 15 is a block diagram of a logic device according to another example embodiment.

FIG. 15 is a block diagram of a logic device LGDc according to at least one other example embodiment. Referring to FIG. 15, the logic device LGDc may include a plurality of logic blocks LB, a plurality of connection blocks CB, a plurality of switch blocks SWB, and a plurality of input/output terminals I/O.

Each of the plurality of connection blocks CB is disposed between two adjacent logic blocks LB or between one of the plurality of logic blocks LB and one of the plurality of input/output terminals I/O. Each of the plurality of connection blocks CB controls a connection between the plurality of logic blocks LB or controls a connection between the plurality of logic blocks LB and the plurality of input/output terminals I/O. Each of the plurality of switch blocks SWB is disposed between two adjacent connection blocks CB. Each of the plurality of switch blocks SWB controls a connection between the plurality of connection blocks CB.

A plurality of input/output terminals I/O are connected to one of the plurality of connection blocks CB or one of the plurality of logic blocks LB. Via the plurality of input/output terminals I/O, the logic device LGDc may receive the configuration selection signal CSEL of FIG. 1 and the command signal CMD of FIG. 1, and may output the output data DOUT of FIG. 1.

Figure 16:
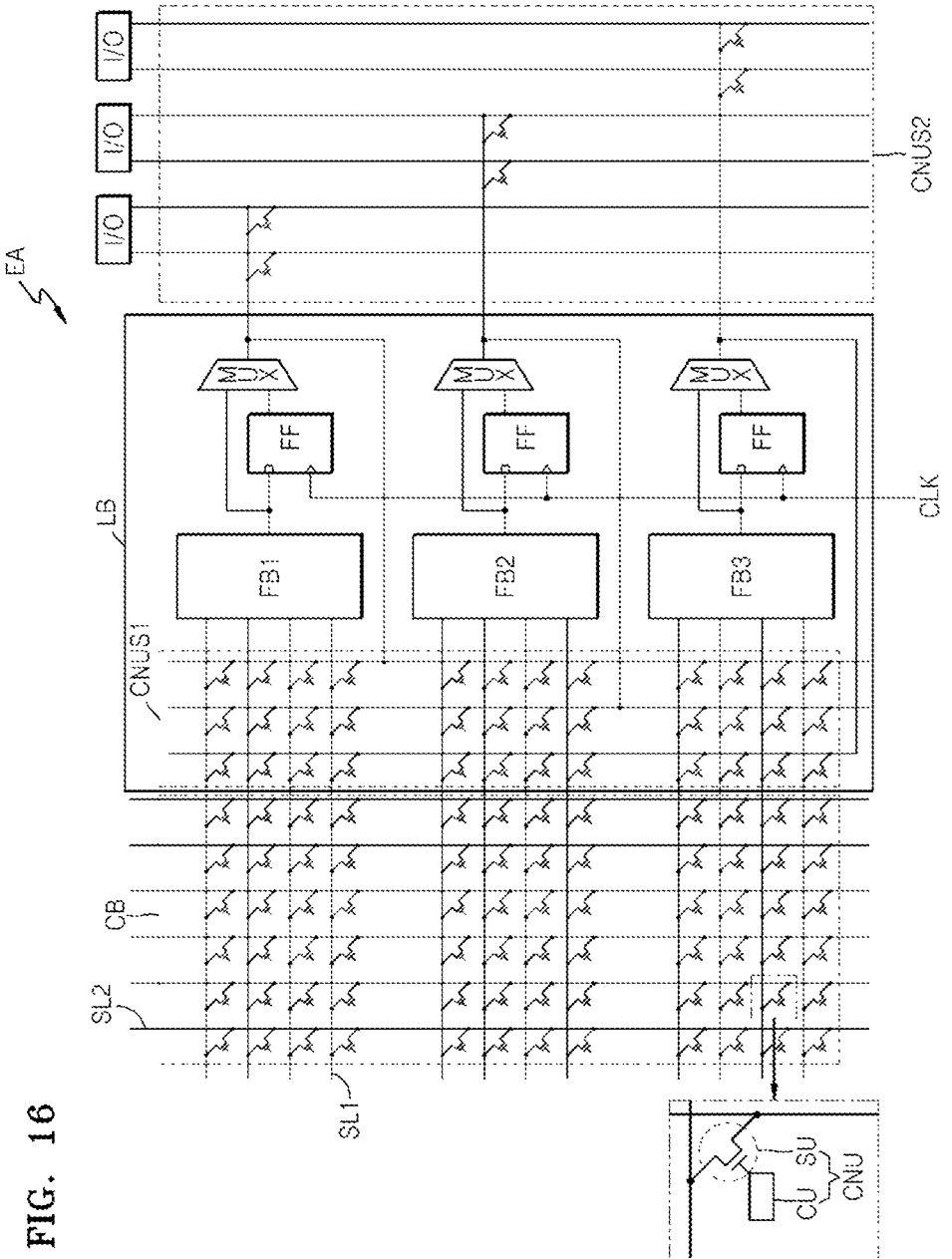
FIG. 16 is a block diagram of a part of the logic device of FIG. 15, indicated by a dotted line, according to an example embodiment.

FIG. 16 is a block diagram of a part EA of the logic device LGDc of FIG. 15, indicated by a dotted line, according to an example embodiment. Referring to FIG. 16, the part EA includes a connection block CB, a logic block LB, and a plurality of input/output terminals I/O.

The connection block CB includes a plurality of signal lines SL1 and SL2 and a plurality of connection units CNU. The plurality of signal lines SL1 and SL2 include a plurality of first signal lines SL1 disposed in a first direction and a plurality of second signal lines SL2 disposed in a second direction. The plurality of connection units CNU control a connection between the plurality of first signal lines SL1 and the plurality of second signal lines SL2. Each of the plurality of first signal lines SL1 is connected to one of input terminals of a plurality of functional blocks FB1 to FB3.

The logic block LB includes the plurality of functional blocks FB1 to FB3. The plurality of functional blocks FB1 to FB3 of FIG. 16 may be as described with reference to FIGS. 1 to 14.

The logic block LB may further include a plurality of flip flops FF and a plurality of multiplexers MUX. Each of the plurality of flip flops FF may receive an output signal of one of the plurality of functional blocks FB1 to FB3 and a clock signal CK. Each of the plurality of multiplexers MUX may receive the output signal of one of the functional blocks FB1 to FB3 and an output signal of one of the plurality of flip flops FF. Timing of the output signals respectively output from the functional blocks FB1 to FB3 may be controlled using the plurality of flip flops FF and the plurality of multiplexers MUX.

The output signals of the functional blocks FB1 to FB3 may be applied to a first connection unit set CNUS1 and a second connection unit set CNUS2. Each of the first connection unit set CNUS1 and the second connection unit set CNUS2 includes a plurality of connection units CNU.

The first connection unit set CNUS1 may control a connection between the functional blocks FB1 to FB3 by using the plurality of connection units CNU thereof. For example, the output signal of the first functional block FB1 may be applied to the second functional block FB2 or the third functional block FB3 via the first connection unit set CNUS1.

The second connection unit set CNUS2 may control a connection between output terminals of the functional blocks FB1 to FB3, which output the output signals, and the plurality of input/output terminals I/O by using the plurality of connection units CNU thereof.

The plurality of connection units CNU included in the connection block CB and the first and second connection unit sets CNUS1 and CNUS2 illustrated in FIG. 16 may be the same as the connection units CNU and CNU1 to CNU3 described above with reference to FIGS. 8 to 14.

Figure 17:
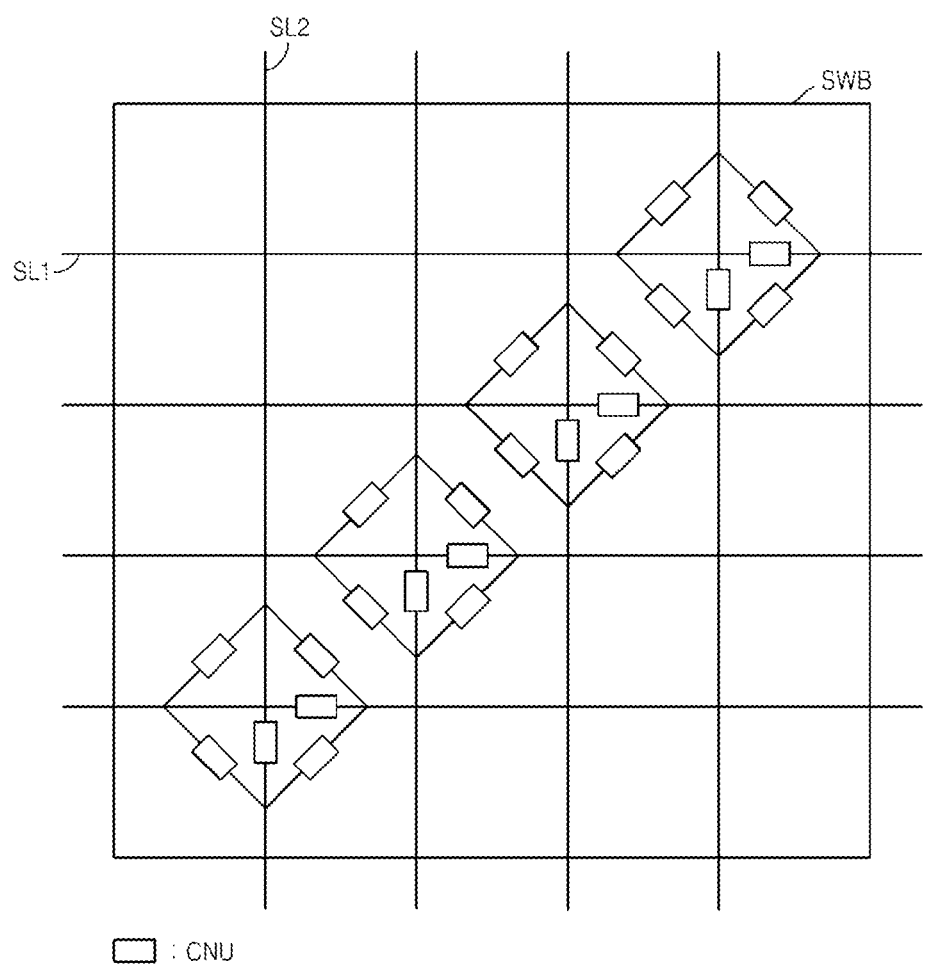
FIG. 17 is a block diagram of one of switch blocks included in the logic device of FIG. 15, according to an example embodiment.

FIG. 17 is a block diagram of one of the plurality of switch blocks SW included in the logic device LGDc of FIG. 15, according to at least one example embodiment. Referring to FIG. 17, the switch block SWB includes a plurality of signal lines SL1 and SL2 and a plurality of connection units CNU. The plurality of signal lines SL1 and SL2 includes a plurality of first signal lines SL1 disposed in a first direction and a plurality of second signal lines SL2 disposed in a second direction. Referring to FIG. 17, a plurality of connection units CNU are disposed between the plurality of signal lines SL1 and SL2 to control a connection between the plurality of signal lines SL1 and SL2.

The plurality of connection units CNU of FIG. 17 may be the same as the connection units CNU and CNU1 to CNU3 described above with reference to FIGS. 8 to 14.

According to the one or more example embodiments, efficient logic devices and methods of operating the same are provided.

A logic device according to at least one example embodiment includes a functional block that includes a first storage block and a second storage block. Thus, a second function that is to be performed in a subsequent operation time period may be configured in a configured storage block selected from among the first and second storage blocks, and a first function that was configured in a previous operation time period may be performed on the other storage block that is a non-configured storage block. In other words, in the functional block, configuring the second function and performing the first function may be simultaneously performed. Thus, the second function may be performed right after the first function is performed. In this case, a configuration selection signal for selecting the configured storage block may be embodied as a simple signal, e.g., a 1-bit signal.

Accordingly, a time needed to perform the second function may be reduced and the speed of a response of the logic device may be increased. Thus, the overall performance of the logic device may be enhanced.

The logic device may further include a connection unit for controlling a connection between a first signal line and a second signal line, and the connection unit may include a first memory device and a second memory device. Thus, second connection information related to a subsequent operation time period may be stored in a configured memory device selected from among the first and second memory devices, first connection information may have been stored in the other memory device that is a non-configured memory device in a previous operation time period, and a connection between the first signal line and the second signal line may be controlled based on the first connection information.

As described above, according to the one or more example embodiments, a logic device that may perform various functions and operate at high speeds and a method of operating the same are provided.

It should be understood that the example embodiments described herein should be considered in a descriptive sense only and not for purposes of limitation. Descriptions of features or aspects within each example embodiment should typically be considered as available for other similar features or aspects in other example embodiments.

What is claimed is:

1. A logic device comprising:
    a first functional block, the first functional block including,
        a first storage block,
        a second storage block, and
        a first function controller, the first function controller being configured to, in a first operation time period, receive a first configuration selection signal and a first configuration command signal that instructs a first function be configured, select the first storage block as a configured storage block in the first operation time period based on the first configuration selection signal, and configure the first function in the first storage block based on the first configuration command signal.

2. The logic device of claim 1, wherein, in the first operation time period, a second function is already configured in the second storage block.

3. The logic device of claim 2, wherein, in the first operation time period, the first function controller is configured to receive a first function command signal and perform the second function on the second storage block based on the first function command signal.

4. The logic device of claim 3, wherein, in a second operation time period, the first function controller is configured to receive a second configuration selection signal and a second function command signal, select the second storage block as a configured storage block in the second operation time period based on the second configuration selection signal, and perform the first function on the first storage block based on the second function command signal.

5. The logic device of claim 4, wherein, in the second operation time period, the first function controller is configured to receive a second configuration command signal that instructs a third function be configured, and configure the third function on the second storage block based on the second configuration command signal.

6. The logic device of claim 1, further comprising:
a second functional block; and
a connection unit, the connection unit including,
    a first memory device,
    a second memory device, and
    a connection controller, the connection controller being configured to, in the first operation time period, select the first memory device as a configured memory device in the first operation time period based on the first configuration selection signal, and control a connection between the first functional block and the second functional block based on first connection information stored in the second memory device.

7. The logic device of claim 6, wherein, in the first operation time period, the connection controller is configured to store second connection information in the first memory device.

8. The logic device of claim 7, wherein, in the second operation time period, the connection controller is configured to select the second memory device as a configured memory device in the second operation time period based on the second configuration selection signal, and is configured to control a connection between the first functional block and the second functional block based on the second connection information stored in the first memory device.

9. The logic device of claim 8, wherein the connection unit further includes a switch unit connected between the first functional block and the second functional block, the switch unit being controlled by the connection controller.

10. The logic device of claim 1, wherein a first lookup table corresponding to the first function is stored in the first storage block when the first function is configured.

11. A logic device comprising:
a plurality of functional blocks, each of the plurality of functional blocks including,
    a first storage block and a second storage block, one of the first storage block and the second storage block being selected as a configured storage block based on the configuration selection signal, the configured storage block being configured to perform a write operation, and a non-configured storage block that is not selected as the configured storage block being configured to perform a read operation; and
a plurality of signal lines between the plurality of functional blocks.

12. The logic device of claim 11, wherein a first function is configured in the configured storage block when the write operation is performed, and a second function configured in the non-configured storage block is performed when the read operation is performed.

13. The logic device of claim 11, further comprising:
a connection unit connected between a first signal line and a second signal line from among the plurality of signal lines, the connection unit configured to control a connection between the first and second signal lines using first connection information, the connection unit including,
    a first memory device and a second memory device, one of the first memory device and the second memory device being selected as a configured memory device based on the configuration selection signal, and the first connection information being read from a non-configured memory device that is not selected as the configured memory device.

14. The logic device of claim 13, wherein second connection information is stored in the configured memory device.

15. The logic device of claim 14, wherein each of the first memory device and the second memory device is a resistive memory device.

16. A method of operating a logic device comprising:
receiving a first configuration selection signal and a first configuration command signal that instructs a first function be configured in a functional block during a first operation time period, the functional block including a first storage block and a second storage block;
selecting the first storage block as a configured storage block in the first operation time period based on the first configuration selection signal in the first operation time period; and
configuring a first function in the first storage block based on the first configuration command signal in the first operation time period.

17. The method of claim 16, further comprising:
configuring a second function in the second storage block before the first operation time period.

18. The method of claim 17, further comprising:
receiving a first function command signal in the first operation time period; and
performing the second function on the second storage block based on the first function command signal in the first operation time period.

19. The method of claim 18, further comprising:
receiving a second configuration selection signal and a second function command signal in a second operation time period;
selecting the second storage block as a configured storage block in the second operation time period based on the second configuration selection signal in the second operation time period; and
performing the first function on the first storage block based on the second function command signal in the second operation time period.

20. The method of claim 19, further comprising:
receiving a second configuration command signal in the second operation time period that instructs a third function be configured; and configuring the third function in the second storage block based on the second configuration command signal in the second operation time period.

\* \* \* \* \*